United States Patent
Zhou et al.

(10) Patent No.: US 8,546,855 B2
(45) Date of Patent: Oct. 1, 2013

(54) CHARGING PROTECTION DEVICE

(75) Inventors: Jingrong Zhou, Austin, TX (US); David Wu, Austin, TX (US); James F. Buller, Austin, TX (US)

(73) Assignee: Globalfoundres Inc., Grand Cayman (KY)

( * ) Notice: Subject to any disclaimer, the term of this patent is extended or adjusted under 35 U.S.C. 154(b) by 104 days.

(21) Appl. No.: 13/239,865

(22) Filed: Sep. 22, 2011

(65) Prior Publication Data
US 2012/0007182 A1    Jan. 12, 2012

Related U.S. Application Data

(62) Division of application No. 12/483,737, filed on Jun. 12, 2009, now Pat. No. 8,048,753.

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC ...... 257/288; 257/79; 257/347; 257/E27.112; 257/E21.042; 257/E21.051; 257/E21.32; 257/E21.37; 257/E21.311; 257/E21.352; 257/E21.55; 257/E21.546

(58) Field of Classification Search
USPC ........... 257/79, 347, 288, 607, 656, E21.042, 257/E21.051, E21.32, E21.352, E21.311, 257/E21.37, E21.55, E21.546
See application file for complete search history.

(56) References Cited

U.S. PATENT DOCUMENTS

| | | | |
|---|---|---|---|
| 5,198,379 | A | 3/1993 | Adan |
| 5,314,841 | A | 5/1994 | Brady et al. |
| 6,074,899 | A * | 6/2000 | Voldman ............... 438/155 |
| 6,358,782 | B1 | 3/2002 | Masuda |
| 6,969,891 | B1 | 11/2005 | Leroux |
| 7,414,289 | B2 | 8/2008 | Wu et al. |
| 8,048,753 | B2 * | 11/2011 | Zhou et al. ............. 438/199 |
| 2005/0269642 | A1 | 12/2005 | Minami |
| 2006/0226485 | A1 | 10/2006 | Arakawa |
| 2007/0080404 | A1 | 4/2007 | Fukuro et al. |
| 2008/0138941 | A1 | 6/2008 | Pelella |
| 2008/0303089 | A1 | 12/2008 | Zhu et al. |

OTHER PUBLICATIONS

International Preliminary Report on Patentability for corresponding Application PCT/US2010/037592, date of issuance: Dec. 12, 2011, pp. 1-6.

(Continued)

*Primary Examiner* — David Nhu
(74) *Attorney, Agent, or Firm* — Ditthavong Mori & Steiner, P.C.

(57) ABSTRACT

Shallow trench isolation silicon-on-insulator (SOI) devices are formed with improved charge protection. Embodiments include an SOI film diode and a $P^+$ substrate junction as a charging protection device. Embodiments also include a conductive path from the SOI transistor drain, through a conductive contact, a metal line, a second conductive contact, an SOI diode, isolated from the transistor, a third conductive contact, a second conductive line, and a fourth conductive contact to a $P^+$-doped substrate contact in the bulk silicon layer of the SOI substrate.

10 Claims, 5 Drawing Sheets

(56) References Cited

OTHER PUBLICATIONS

Office Action for related U.S. Appl. No. 12/483,737, Feb. 7, 2011, pp. 1-7.

International Search Report and Written Opinion for corresponding application PCT/US2010/037592, dated Aug. 13, 2010, pp. 1-13.

Office Action for related U.S. Appl. No. 12/483,737, Oct. 20, 2010, pp. 1-8.

* cited by examiner

CHARGING PROTECTION DEVICE

CROSS-REFERENCE TO RELATED APPLICATION

The present application is a divisional application of U.S. application Ser. No. 12/483,737, filed on Jun. 12, 2009, the entire contents of which are herein incorporated by reference.

TECHNICAL FIELD

The present disclosure relates to silicon-on-insulator (SOI) semiconductor devices, and, more, particularly to SOI devices with charging protection, and to fabrication techniques.

BACKGROUND

In modern integrated circuits, the number and density of individual circuit elements, such as field effect transistors, is steadily increasing and, as a consequence, performance of these integrated circuits is currently improving. The increase in package density and signal performance of integrated circuits requires the reduction of critical feature sizes, such as the gate length and the channel length of field effect transistors, to minimize the chip area occupied by a single circuit element and to reduce signal propagation delay resulting from a delayed channel formation. However, currently critical feature sizes are approaching 0.1 µm and less and a further improvement in circuit performance by reducing the sizes of the transistor elements is partially offset by parasitic capacitances of the transistors formed in bulk silicon substrates.

To meet the ever-increasing demands with respect to device and circuit performance, circuit designers have proposed new device architectures. One technique to improve performance of a circuit, for example of a CMOS device, is to fabricate the circuit on a so-called silicon-on-insulator (SOI) substrate, as illustrated to the left of line 101 in FIG. 1. An SOI substrate comprises an insulating layer 103 formed on a bulk substrate 105, for example, a silicon substrate. The insulating layer is generally formed of silicon dioxide and is sometimes referred to as a buried oxide layer or "box" layer. Bulk substrate 105 is typically P-doped. An active silicon layer 107 is formed on the insulating layer. Active regions 109 for a field effect transistor device, defined by shallow trench isolation structures 111, are formed in active silicon layer 107. For an N-MOS transistor, the active regions 109 (the source and drain of the transistor) are N-doped and the region 113 between active regions 109 is P-doped. Further, a gate electrode 115, e.g., of polysilicon, formed on a gate insulation layer 117, and sidewall spacers 119, on both sides of the gate electrode, are formed on region 113 of active silicon layer 107. The resulting transistor is entirely electrically isolated from the regions surrounding the transistor area. Contrary to a conventional device formed on a bulk semiconductor substrate, the isolation of the active region of the SOI device significantly suppresses parasitic effects known from conventional devices, such as latch-up and leakage currents drifting into the substrate. SOI devices are also characterized by lower parasitic capacitances compared to devices formed on a bulk semiconductor substrate and, hence, exhibit an improved high-frequency performance. Moreover, due to the significantly reduced volume of the active region, radiation-induced charge carrier generation is also remarkably reduced thereby rendering SOI devices extremely suitable for applications in radiation-intensive environments.

However, it is also well known that during operation undesirable charges may accumulate below the channel region of the transistor, thereby adversely affecting the transistor characteristics, such as the threshold voltage, single-transistor-latch-up, and the like.

Furthermore, undesirable charge damage on devices may also occur during the course of fabricating such SOI structures. For example, the use of plasma-based etching processes may result in undesirable charge damage to components of the SOI device, such as the gate insulation layer.

A conventional approach to the problem of charge damage entails the formation of a substrate $N^+$ diode to protect plasma process charging for SOI devices connected to a non-VSS node, as shown to the right of line 101 in FIG. 1. Specifically, an $N^+$ contact 121 is formed in P-doped substrate 105 and connected to the SOI device via conductive contacts 123 and 125 and metal line 127 (with inter layer dielectric 129 insulating the transistor from metal line 127). However, it was found that such an approach engenders implementation problems due to poor $N^+$ junction diode properties or to interaction with substrate properties and connections. In addition, as the design creates a virtual VSS node which is higher than VSS, a $P^+$ substrate contact lightning rod approach fails to provide appropriate charging protection for the SOI device.

A need therefore exists for efficient methodology and device providing plasma charging protection for SOI devices which are connected to a non-VSS circuit node, particularly for advanced technology designs and beyond.

SUMMARY

An aspect of the present disclosure is a method of fabricating a semiconductor device comprising forming an SOI film diode and a $P^+$ substrate contact for charging protection.

Another aspect of the present disclosure is a semiconductor device comprising an SOI film diode and a $P^+$ substrate contact as a charging protection structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming an insulating layer on a bulk silicon substrate; forming an active silicon layer on the insulating layer; forming a transistor on the active silicon layer, the transistor including source/drain regions formed in the active silicon layer; forming a diode on the active silicon layer, the diode including two active regions; and electrically connecting the drain region, active diode regions, and bulk silicon layer to form a charging protection device.

Aspects of the present disclosure include forming an interlayer dielectric on the transistor and the diode; forming first, second, third, and fourth contact holes through the interlayer dielectric; filling the first, second, third, fourth contact holes with a conductive material to form first, second, third, and fourth conductive contacts; and forming first and second metal lines on the interlayer dielectric; wherein the first conductive contact connects the drain region of the transistor with the first metal line, the second conductive contact connects one active region of the diode with the first metal line, the third conductive contact connects the second active region of the diode with the second metal line, and the fourth conductive contact connects the second metal line to the bulk silicon layer. Another aspect includes etching a trench in the active silicon layer, prior to forming the inter layer dielectric layer, between the transistor and the diode, and filling the trench with an insulating material, to form a shallow trench isolation region. A further aspect includes forming a substrate contact by ion implanting a $P^+$-dopant, e.g., boron, into the bulk silicon substrate, which may be P-doped, through the fourth contact hole, prior to filling the fourth contact hole. Another aspect includes filling the contact holes with tungsten or polysilicon. An additional aspect includes patterning a metal 1 layer to form the first and second metal lines.

Another aspect of the present disclosure is a semiconductor device comprising: a silicon-on-insulator (SOI) substrate including a bulk silicon layer; an active silicon layer on the SOI substrate; a transistor formed in the active silicon layer, the transistor including source/drain regions; a diode formed in the active silicon layer, the diode including two active regions; wherein, the drain region, active diode regions, and bulk silicon layer are electrically connected to form a charging protection device.

Aspects include first, second, third, and fourth conductive contacts; and first and second metal lines; wherein the first conductive contact connects the drain of the transistor with the first metal line, the second conductive contact connects one active region of the diode with the first metal line, the third conductive contact connects the second active region of the diode with the second metal line, and the fourth conductive contact connects the second metal line to the bulk silicon layer. A further aspect includes a shallow trench isolation region between the transistor and the diode. Another aspect includes a $P^+$-doped substrate contact in the bulk silicon layer, which may be P-doped, connected to the fourth conductive contact. A further aspect includes the transistor being an NMOS transistor, and one diode active region being $N^+$-doped and the other being $P^+$-doped. An additional aspect includes the first, second, third, and fourth conductive contacts comprising tungsten or polysilicon and being formed through an interlayer dielectric on the transistor and the diode. Another aspect includes a metal 1 pattern on the interlayer dielectric layer, forming the first and second metal lines.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
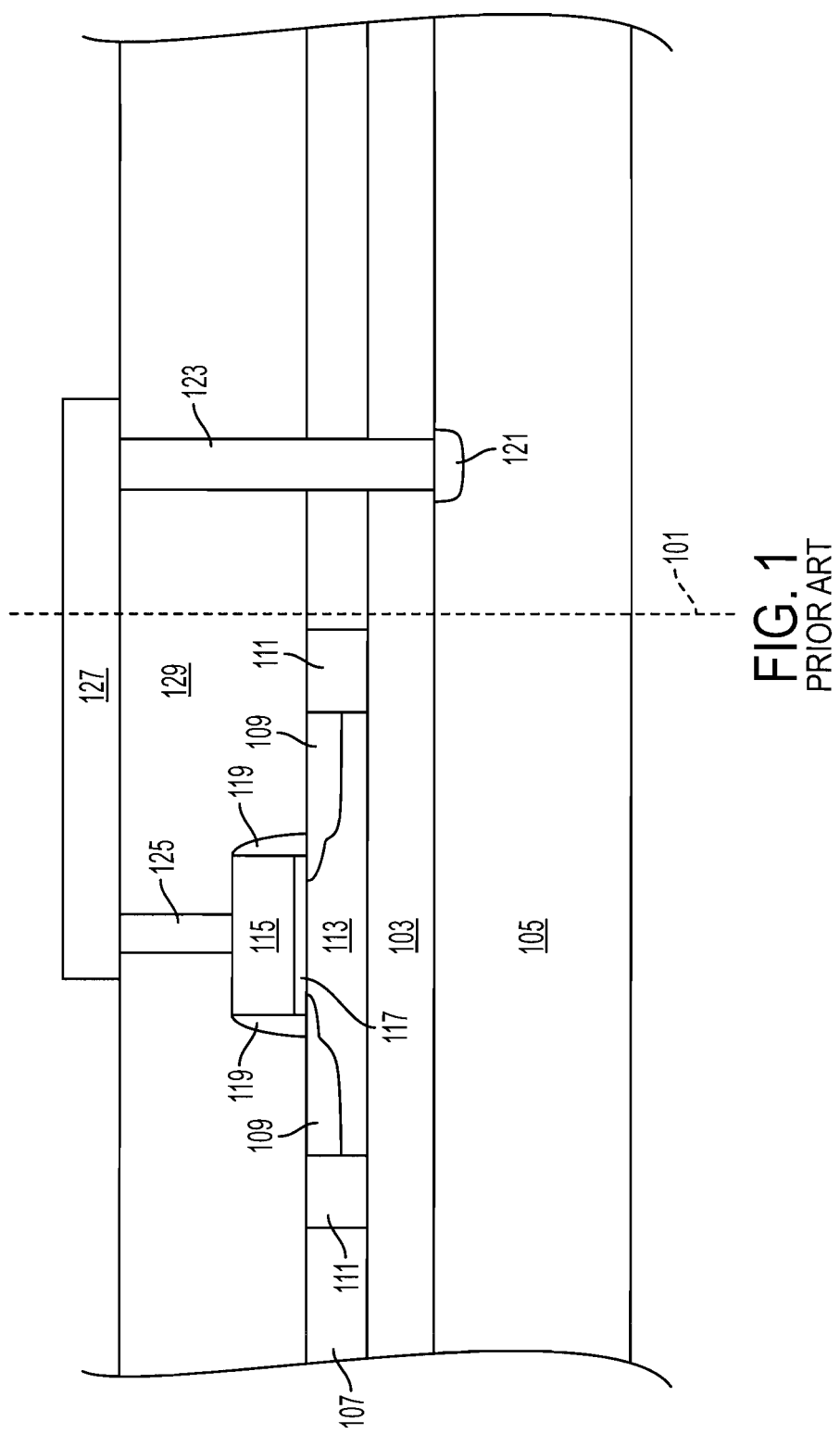
FIG. 1 schematically illustrates a prior art SOI semiconductor device with charging protection.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

Conventional practices include forming semiconductor circuits, e.g., transistors, on SOI substrates, with shallow trench isolation of the active region to suppress parasitic effects, such as latch-up and leakage currents drifting into the substrate. To protect the device against charges that may accumulate below the channel region of the transistor, thereby adversely affecting the transistor characteristics, such as the threshold voltage and single-transistor-latch-up, a substrate $N^+$ diode or $P^+$ substrate contact lightning rod has been employed. However, both methods fail to protect the device from plasma charging damage that occurs during plasma etching processes.

The present disclosure addresses and solves the problem of plasma charging damage. In accordance with embodiments of the present disclosure, an SOI film diode and a $P^+$ substrate junction are provided to provide charging protection. The diode includes two active regions and is formed isolated from the SOI transistor. A drain region of the transistor, the active diode regions, and the bulk silicon layer of the SOI substrate are electrically connected to form a charging protection device.

Embodiments of the present disclosure include forming an interlayer dielectric on the transistor and the diode, forming four contact holes through the inter layer dielectric layer, and filling the four contact holes with a conductive material, e.g., tungsten or polysilicon, to form four conductive contacts. Further, two metal lines are formed, e.g., by patterning a metal 1 layer, on the interlayer dielectric, such that one conductive contact connects the drain region of the transistor with the first metal line, the second conductive contact connects an active region of the diode with the first metal line, the third conductive contact connects the second active region of the diode with the second metal line, and the fourth conductive contact connects the second metal line to the bulk silicon layer. Methodology further includes etching a trench in the active silicon layer between the transistor and the diode, and filling the trench with an insulating material, e.g., silicon dioxide, to form a shallow trench isolation region. Methodology further includes forming a substrate contact by ion implanting a $P^+$-dopant, e.g., Boron (B), into the bulk silicon layer of the SOI substrate, through the fourth contact hole, prior to filling the fourth contact hole.

A typical semiconductor device comprises an SOI substrate including a bulk silicon layer, an active silicon layer on the SOI substrate, a transistor, e.g., an NMOS transistor, formed in the active silicon layer, the transistor including source/drain regions, e.g., defined by shallow trench isolation regions, for example of silicon dioxide. To protect the device against charge accumulation, a conductive path from the drain to the bulk silicon layer has been included. A conductive contact through an interlayer dielectric connects the transistor drain to a metal line, and another conductive contact through the inter layer dielectric layer connects the metal line to the bulk silicon layer. However, the charge protection was found to be insufficient to protect the transistor from plasma charging damage that occurs during plasma charging processes.

In accordance with embodiments of the present disclosure, a diode is formed on the SOI substrate, isolated from the transistor by the shallow trench isolation region, and in the conductive path between the transistor drain and the bulk silicon layer, such that the drain region of the transistor, the active diode regions, and the bulk silicon layer of the SOI substrate are electrically connected to form a charging protection device. Specifically, the second conductive contact connects the metal line to an active region of the diode, a third conductive contact connects a second active region of the diode to a second metal line, and a fourth conductive contact connects the second metal line to the bulk silicon layer. The conductive contacts may be formed of tungsten or polysilicon, and the metal lines may be part of a metal 1 layer formed on the inter layer dielectric layer. The diode may either be forward biased, with the first active region being $P^+$-doped and the second active region being $N^+$-doped, or reverse biased, with the first active region being $N^+$-doped and the second active region being $P^+$-doped. In addition, a $P^+$-doped substrate contact may be formed in the bulk silicon layer and connected to the fourth conductive contact.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
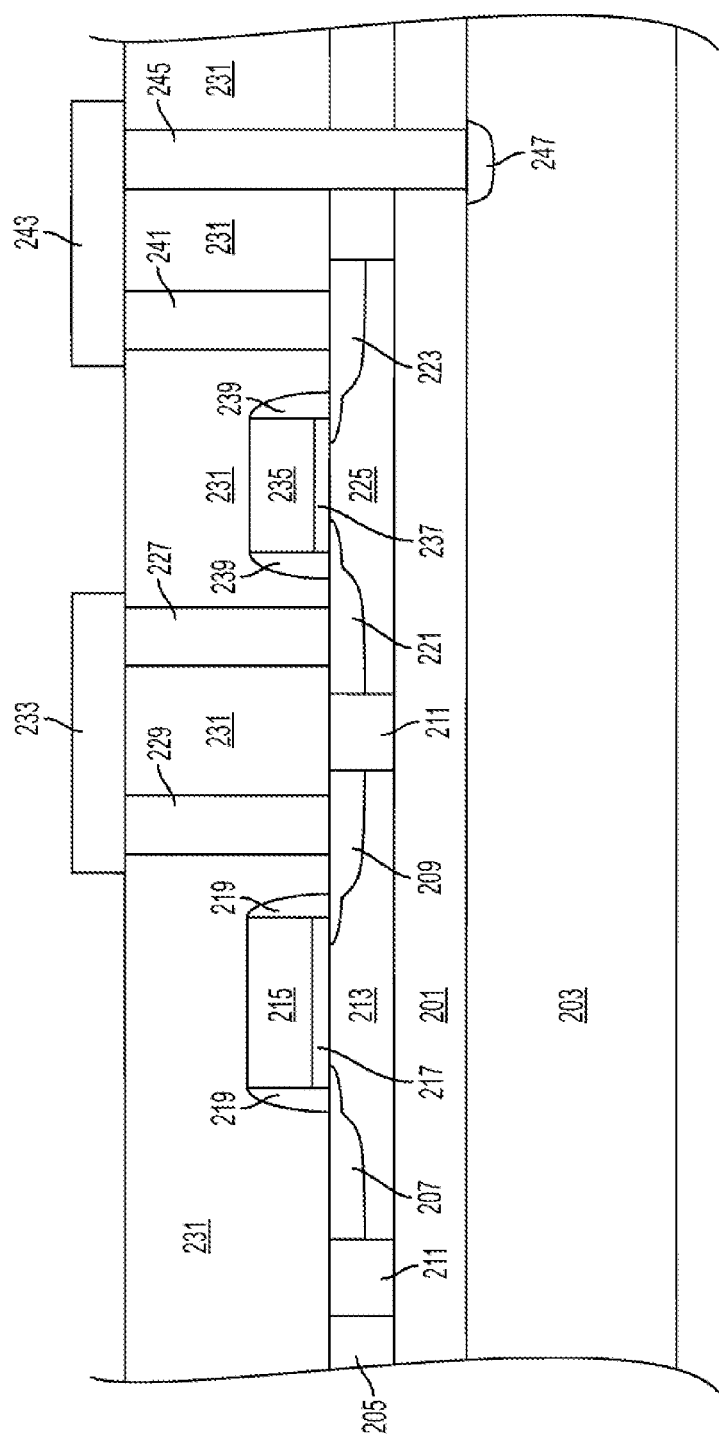
FIG. 2 schematically an SOI semiconductor device with charging protection, according to an exemplary embodiment.

FIG. 2 illustrates an SOI device with charging protection, according to an exemplary embodiment. The SOI device includes an insulating layer 201, e.g., a silicon dioxide layer, formed on a bulk substrate 203, e.g., a P-doped silicon substrate, and an active silicon layer 205 formed on the insulating layer 201. The insulating layer is a buried oxide layer or "box" layer. $N^+$-doped active regions 207 and 209 are formed in silicon layer 205 and are defined by shallow trench isolation structures 211. Between active regions 207 and 209, active silicon layer 205 is P-doped, forming region 213. On region 213, the SOI device further includes a gate electrode 215, on a gate insulation layer 217, and sidewall spacers 219, on both sides of the gate electrode 215.

The charging protection in FIG. 2 includes an SOI diode and a $P^+$ substrate junction. The SOI diode is formed on active silicon layer 205, isolated from the transistor via shallow trench isolation structures 211. A reverse biased SOI diode includes an active region 221 which is $N^+$-doped, an active region 223 which is $P^+$-doped, and an N-doped region 225 therebetween. Active region 221 is connected to active region 209, the transistor drain, via conductive contacts 227 and 229, formed through interlayer dielectric 231, e.g., of tungsten or polysilicon, and via metal line 233, formed on interlayer dielectric 231. Metal line 233 may be part of the metal 1 layer of the semiconductor device. The diode further includes gate electrode 235, e.g., of polysilicon, gate insulating layer 237, and sidewall spacers 239. For a forward biased SOI diode, the active regions 221 and 223 are reversed, i.e., active region 221 is $P^+$-doped and active region 223 is $N^+$-doped.

A conductive contact 241 connects active region 223 to metal line 243, and conductive contact 245 connects metal line 243 to bulk substrate 203 through a $P^+$ substrate contact 247. Conductive contacts 241 and 245 may be formed of tungsten or polysilicon, for example, and metal line 243 may be part of the semiconductor's metal 1 layer, as metal line 233.

Figure 3A:
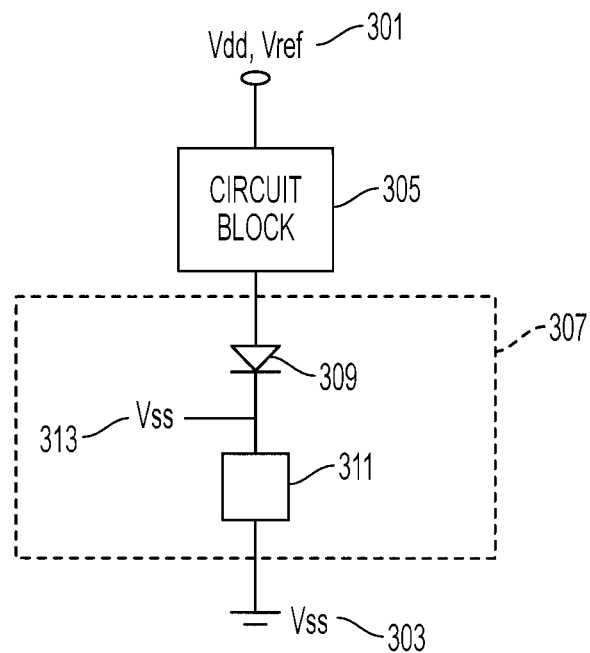
FIG. 3 schematically illustrates a circuit diagram of a semiconductor device with charging protection, according to an exemplary embodiment.
Figure 3B:
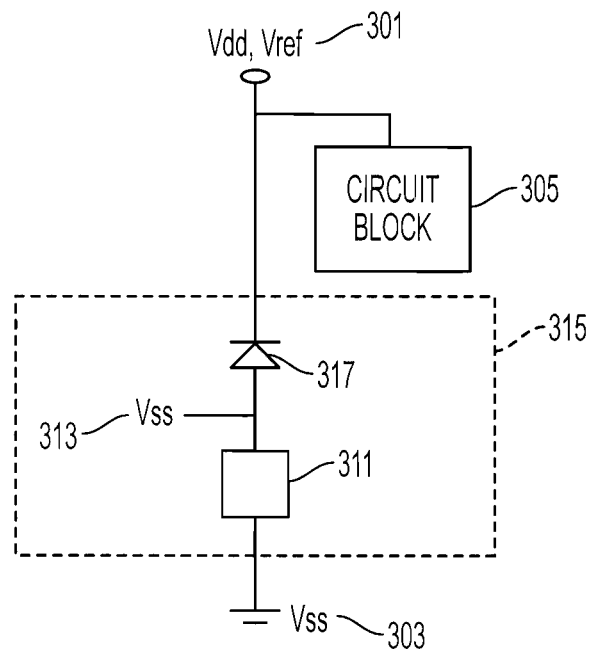

FIGS. 3A and 3B schematically illustrate circuit diagrams of semiconductor devices with charge protection, according to exemplary embodiments, employing forward biased and reverse biased SOI diodes, respectively. In FIG. 3A Vdd node 301 and Vss node 303 provide positive and negative voltage supplies for circuit block 305. Vdd node 301 connects to the drain of the semiconductor, and Vss represents the SOI substrate. Between circuit block 305 and the Vss node is charging protection 307, which includes forward biased diode 309 and lightning rod 311 in series, with a virtual Vss 313 in between. Lightning rod 311 is formed of contact 245 and metal line 243 from FIG. 2. Accumulated charge in the body of the transistor may dissipate, or drain off, to the P-doped bulk substrate 203 via the conductive path established by diode 309 and lightning rod 311. In FIG. 3B, charging protection 315 includes a reverse biased diode 317 instead of forward biased diode 309.

FIGS. 4A-4D schematically illustrate a process for fabricating an SOI semiconductor device with charging protection, according to an exemplary embodiment. Adverting to FIG. 4A, a buried oxide (BOX) layer 401 is deposited on a bulk silicon substrate 403. The bulk silicon substrate 403 may be P-doped prior to the deposition of BOX layer 401. The substrate 403 and BOX layer 401 form an SOI substrate. An active layer 405, e.g., of silicon, is deposited on BOX layer 401. Next, trench isolation regions 407 are formed in active layer 405 by conventional techniques for trench etching, deposition, and polishing. The material deposited in the trenches of the trench isolation regions 407 may, for example, be silicon dioxide.

Figure 4A:
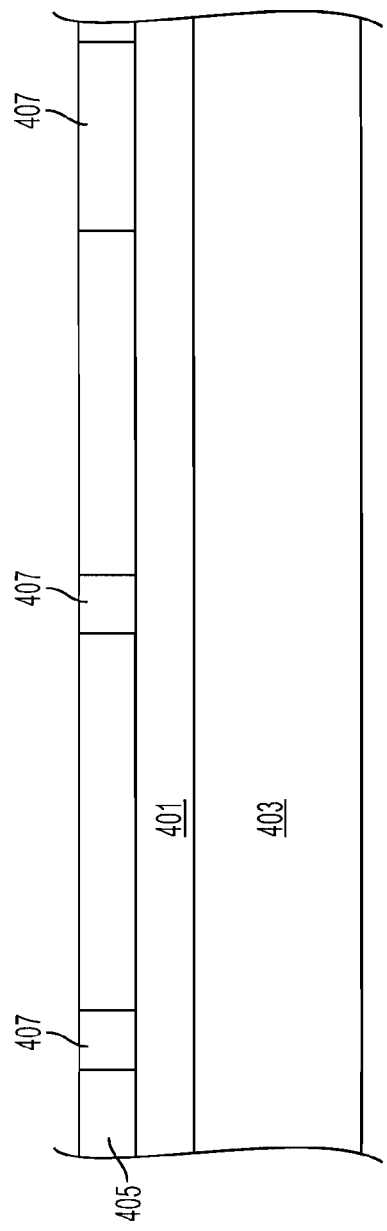
FIGS. 4A-4D schematically illustrate a process for fabricating an SOI semiconductor device with charging protection, according to an exemplary embodiment.
Figure 4B:
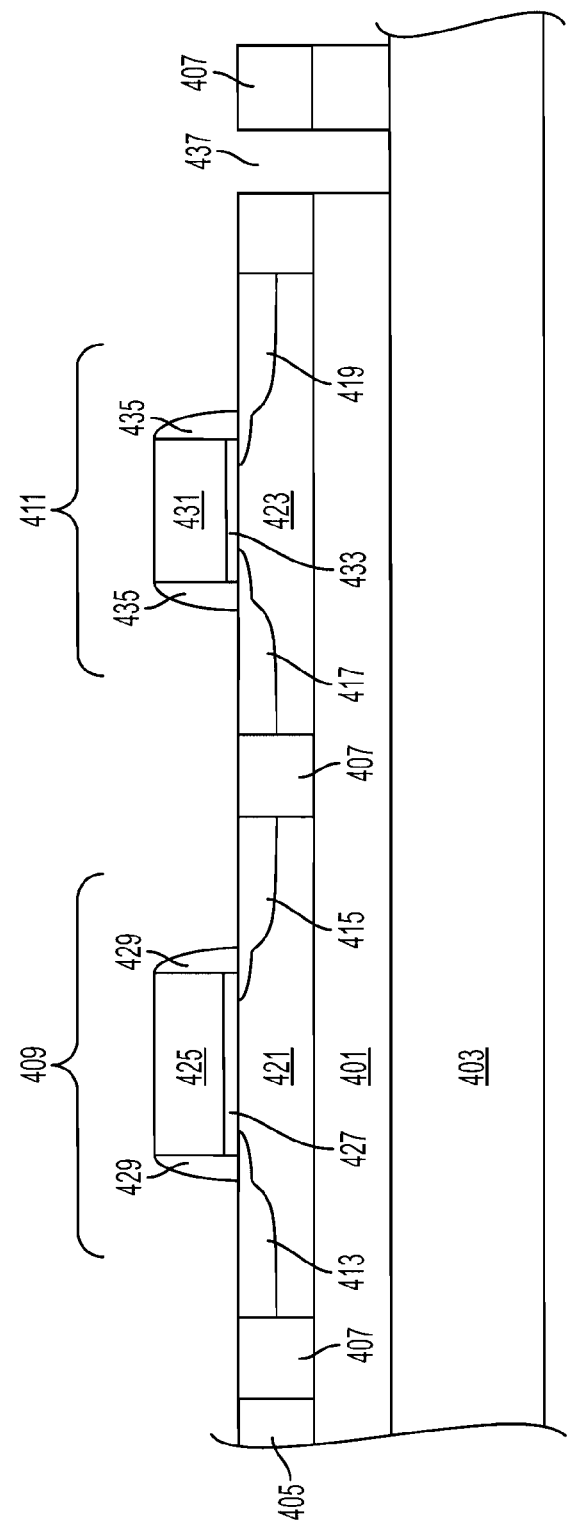

In FIG. 4B, transistor 409 and diode 411 are formed on active layer 405, by conventional techniques, each isolated on both sides by trench isolation regions 407. Transistor 409 includes source and drain regions 413 and 415, and diode 411 includes first and second active regions 417 and 419. P-doped region 421 is formed between source and drain regions 413 and 415, and N-doped region 423 is formed between first and second active regions 417 and 419, e.g., by ion implantation. Transistor 409 includes gate electrode 425, e.g., of polysilicon, gate dielectric 427, e.g., of silicon dioxide, and sidewall spacers 429. Similarly, diode 411 includes gate electrode 431, e.g., of polysilicon, gate dielectric 433, e.g., of silicon dioxide, and sidewall spacers 435.

A contact hole 437 is formed through layers 401 and 405 by conventional techniques, e.g., etching or photolithography. Contact hole 437 may be formed prior to the formation of transistor 409 and diode 411.

Figure 4C:
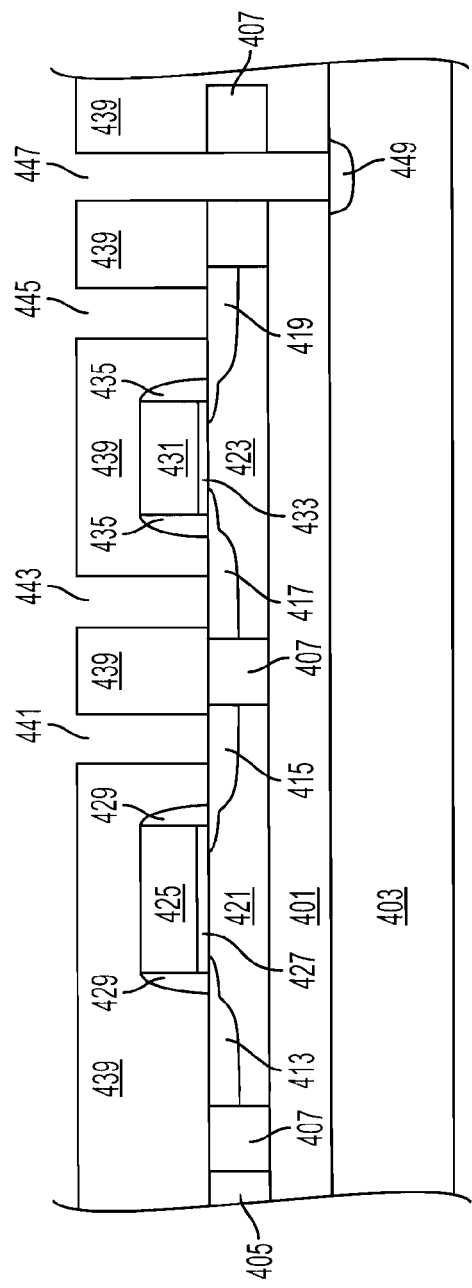

Adverting to FIG. 4C, an interlayer dielectric 439, e.g., a silicon oxide, is deposited over transistor 409 and diode 411. Contact holes 441, 443, 445, and 447 are formed in interlayer dielectric 439, by conventional techniques, e.g., photolithography and etching, through a patterned mask (not shown for illustrative convenience). Contact hole 447 aligns with contact hole 437. A $P^+$-dopant, e.g., boron (B), is ion implanted into silicon substrate 403 through contact hole 447 to form substrate contact 449. The B may be implanted at a dopant dose of about $10^{14}$-$10^{15}$ ions/cm$^2$ and at an energy level of approximately 10-50 keV. The substrate contact may alternatively be formed prior to deposition of inter layer dielectric 439.

Figure 4D:
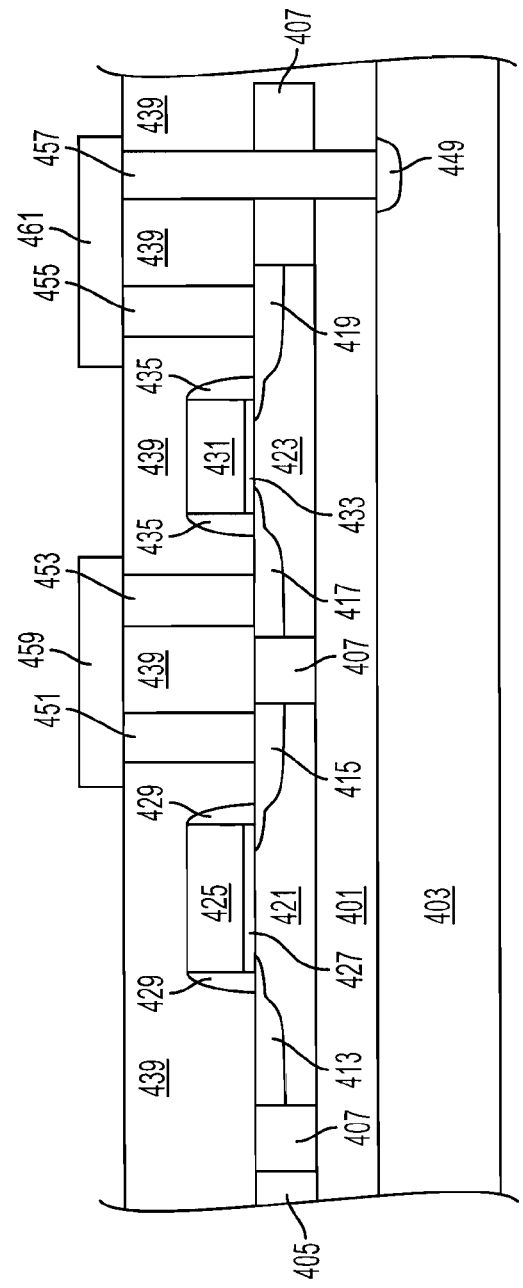

Adverting to FIG. 4D, conductive contacts 451, 453, 455, and 457 are formed by filling contact holes 441, 443, 445, and 447 with a conductive material, e.g., tungsten or polysilicon, by conventional deposition techniques, such as sputter deposition, followed by chemical mechanical polishing to remove the excess material. A metal 1 layer is deposited and patterned on inter layer dielectric layer 439, forming metal line 459, which connects conductive contacts 451 and 453, and metal line 461, which connects conductive contacts 455 and 457.

The embodiments of the present disclosure can achieve several technical effects, including plasma process charging protection for SOI devices, thereby reducing damage to the gate insulation layer and improving transistor characteristics such as threshold voltage and latch-up. The present disclosure enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A semiconductor device comprising:
    a silicon-on-insulator (SOI) substrate including a bulk silicon layer;
    an active silicon layer on the SOI substrate;
    a transistor formed in the active silicon layer, the transistor including source/drain regions; and
    a diode formed in the active silicon layer, the diode including two active regions;
    first, second, third, and fourth conductive contacts;
    first and second metal lines;
    wherein the first conductive contact connects the drain of the transistor with the first metal line, the second conductive contact connects one active region of the diode with the first metal line, the third conductive contact connects the second active region of the diode with the second metal line, and the fourth conductive contact connects the second metal line to the bulk silicon layer;
    wherein, the drain region, active diode regions, and bulk silicon layer are electrically connected to form a charging protection device.

2. The semiconductor device according to claim 1, further comprising a shallow trench isolation region between the transistor and the diode.

3. The semiconductor device according to claim 1, wherein the bulk silicon layer is P-doped.

4. The semiconductor device according to claim 3, further comprising a $P^+$-doped substrate contact formed in the bulk silicon layer and connected to the fourth conductive contact.

5. The semiconductor device according to claim 4, wherein the transistor is an NMOS transistor.

6. The semiconductor device according to claim 4, wherein the first active region of the diode is $N^+$-doped and the second active region is $P^+$-doped.

7. The semiconductor device according to claim 4, wherein the first active region of the diode is $P^+$-doped and the second active region is $N^+$-doped.

8. The semiconductor device according to claim 4, wherein the first, second, third, and fourth conductive contacts comprise tungsten or polysilicon.

9. The semiconductor device according to claim 4, further comprising an interlayer dielectric on the transistor and the diode, wherein the first, second, third, and fourth conductive contacts are formed through the interlayer dielectric and the first and second metal lines are formed on the interlayer dielectric.

10. The semiconductor device according to claim 9, further comprising a metal 1 pattern on the interlayer dielectric, wherein the metal 1 pattern includes the first and second metal lines.

* * * * *